United States Patent
Wu et al.

(10) Patent No.: US 10,361,352 B1
(45) Date of Patent: Jul. 23, 2019

(54) HIGH HEAT DISSIPATION LIGHT EMITTING DIODE PACKAGE STRUCTURE HAVING AT LEAST TWO LIGHT CUPS AND LATERAL LIGHT EMISSION

(71) Applicant: EXCELLENCE OPTO. INC., Miaoli County (TW)

(72) Inventors: Chun-Der Wu, Miaoli County (TW); Tzeng-Guang Tsai, Miaoli County (TW); Kuo-Shu Tseng, Miaoli County (TW); Chih-Chiang Chang, Miaoli County (TW)

(73) Assignee: Excellence Opto, Inc., Miaoli County (TW)

( * ) Notice: Subject to any disclaimer, the term of this patent is extended or adjusted under 35 U.S.C. 154(b) by 0 days.

(21) Appl. No.: 15/928,736

(22) Filed: Mar. 22, 2018

(51) Int. Cl.
| | |
|---|---|
| *H01L 33/64* | (2010.01) |
| *H01L 33/62* | (2010.01) |
| *H01L 25/075* | (2006.01) |
| *H01L 33/54* | (2010.01) |
| *H01L 33/48* | (2010.01) |

(52) U.S. Cl.
CPC ........ *H01L 33/647* (2013.01); *H01L 25/0753* (2013.01); *H01L 33/486* (2013.01); *H01L 33/54* (2013.01); *H01L 33/62* (2013.01)

(58) Field of Classification Search
CPC .. H01L 23/49805; H01L 33/38; H01L 33/647
USPC ......................................................... 257/99
See application file for complete search history.

(56) References Cited

U.S. PATENT DOCUMENTS

| | | | | |
|---|---|---|---|---|
| 8,237,188 B2* | 8/2012 | Oon | ...................... | H01L 33/486 257/99 |
| 2004/0079957 A1* | 4/2004 | Andrews | ................ | H01L 33/486 257/100 |
| 2007/0085101 A1* | 4/2007 | Kim | ........................ | H01L 33/60 257/98 |
| 2007/0252250 A1* | 11/2007 | Hui | ........................ | H01L 33/62 257/672 |
| 2008/0298081 A1* | 12/2008 | Oon | ........................ | H01L 33/62 362/555 |
| 2010/0072499 A1* | 3/2010 | Kwon | .................... | H01L 33/483 257/98 |
| 2010/0072502 A1* | 3/2010 | Kadotani | .............. | H01L 33/642 257/98 |

(Continued)

FOREIGN PATENT DOCUMENTS

TW 1438948 B 5/2014

*Primary Examiner* — George R Fourson, III
(74) *Attorney, Agent, or Firm* — Muncy, Geissler, Olds & Lowe, P.C.

(57) ABSTRACT

A present invention includes at least two light cups and a composite material base. The composite material base comprises a first surface, a second surface and a third surface adjacent to the first surface, and a fourth surface opposite to the first surface. The at least two light cups are formed on the first surface. At least two first metal plates and at least two second metal plates having different polarities and corresponding to the quantity of the light cups are provided on the second surface. One ends of the at least two first and second metal plates individually pass through the composite material base and extend into the light cup to form two electrode contacts, and the other ends of the at least two first metal plates extend to the fourth surface to form an exposed heat dissipation structure.

7 Claims, 4 Drawing Sheets

(56) References Cited

U.S. PATENT DOCUMENTS

| | | | |
|---|---|---|---|
| 2010/0171414 A1* | 7/2010 | Tanikawa | C08L 83/12 |
| | | | 313/502 |
| 2011/0175512 A1* | 7/2011 | Lai | H01L 33/62 |
| | | | 313/46 |
| 2011/0220955 A1* | 9/2011 | Park | H01L 33/645 |
| | | | 257/99 |
| 2012/0057359 A1* | 3/2012 | Kim | H01L 33/62 |
| | | | 362/382 |
| 2014/0138728 A1* | 5/2014 | Moon | C09K 11/778 |
| | | | 257/98 |

* cited by examiner

HIGH HEAT DISSIPATION LIGHT EMITTING DIODE PACKAGE STRUCTURE HAVING AT LEAST TWO LIGHT CUPS AND LATERAL LIGHT EMISSION

FIELD OF THE INVENTION

The present invention relates to a light emitting diode (LED) package structure, and particularly to an LED package structure having two or more light cups and lateral light emission.

BACKGROUND OF THE INVENTION

A light emitting diode (LED) is a cold light emitting device. A light emission principle of an LED is that, a forward bias (current) is applied on a III-V compound semiconductor material, electrons and holes in a diode are combined to convert energy into a form of light, and light is emitted when the energy is released. An LED features advantages of having small volume, long durability, low driving voltage, fast response speed, outstanding shock resistance, and adaptively to requirements of being light and compact as well as adaptively to miniaturization, and has long become a common product in the daily lives.

When used in an application with a high brightness level over an extended period of time, such as outdoor billboards, brake lights and traffic lights, an LED remains in a high temperature environment due to the extended application period, and the durability of a material of the LED is rapidly shortened also due to the high temperature environment. Thus, when an LED is packaged, how to quickly dissipate heat needs to be taken into account so as to increase the durability of the LED.

For example, the Taiwan Patent No. I438948 discloses an LED package structure, in which each of a positive electrode and a negative electrode is wired to electrically connected to an electrical connection portion, which is for soldering onto a substrate. To satisfy heat dissipation needs, a heat dissipation portion (cooling fins) is provided on each of the two electrical connection portions, thus quickly dissipate heat and enhancing the heat dissipation effect through the cooling fins.

However, in the above prior art, to meet heat dissipation needs, cooling fins that use up a considerable volume are used. These cooling fins provided, although achieving the object of heat dissipation, hinder LEDs from being arranged close to one another, resulting in an insufficient intensity of illumination that fails to meet requirements of applications needing extremely high light intensity, e.g., vehicle headlights and projectors. Further, it is also challenging to integrate multiple LEDs having different output wavelengths into one LED to satisfy the need of an output of multiple wavelength light sources.

SUMMARY OF THE INVENTION

Therefore, it is a primary object of the present invention to provide a high heat dissipation light emitting diode (LED) package structure having at least two light cups and lateral light emission to satisfy the need for a high light intensity and an output of multiple wavelength light sources.

A high heat dissipation LED package structure having at least two light cups and lateral light emission includes at least two light cups and a composite material base. The composite material base comprises a first surface, a second surface adjacent to the first surface, a third surface adjacent to the first surface, and a fourth surface opposite to the first surface. Each of the two light cups comprises an accommodating space that is gradually downwardly tapered. The at least two light cups are provided on the first surface. At least two first metal plates and at least two second metal plates having different polarities and corresponding to the quantity of the light cups are provided on the second surface. One ends of at least two first metal plates and the at least two second metal plates individually pass through the composite material base, and extend into the accommodating space of the corresponding light cup to form two electrode contacts. The other ends of the at least two first metal plates individually extend onto the fourth surface to form an exposed heat dissipation structure.

Accordingly, the at least two first metal plates are a formed integral, that is, the electrode contacts and the exposed heat dissipation structure are one formed body, and the at least two first metal plates can simultaneously serve as electrodes and heat dissipation structures. Thus, heat in the LED device can be directly transmitted with high efficiency to outside the LED through the at least two first metal plates, so as to further enhance heat dissipation effects by air convection. The present invention has a simple structure that use up minimal space, and so the at least two light cups of the present invention can be arranged side by side and provide lateral light emission without causing the issue of overheating, thus satisfying the needs for a high light intensity and an output of multiple wavelength light sources.

DETAILED DESCRIPTION OF THE PREFERRED EMBODIMENTS

To better understand and appreciate features, objects and effects of the present invention, a preferred embodiment is given in detail with the accompanying drawings below.

Figure 1:
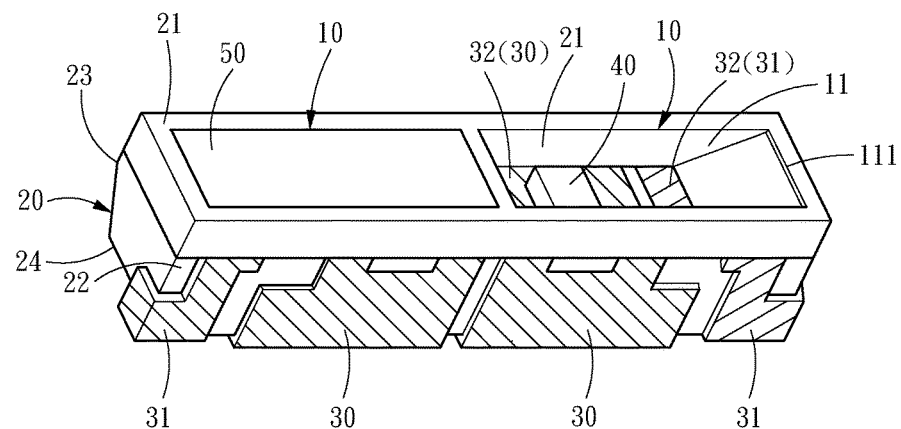
FIG. 1 is a structural schematic diagram of the present invention.
Figure 2:
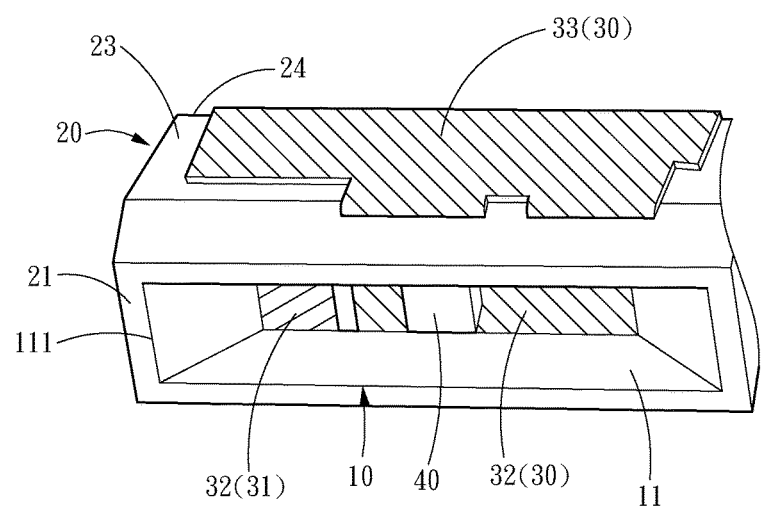
FIG. 2 is a partial structural schematic diagram of the present invention.
Figure 3:
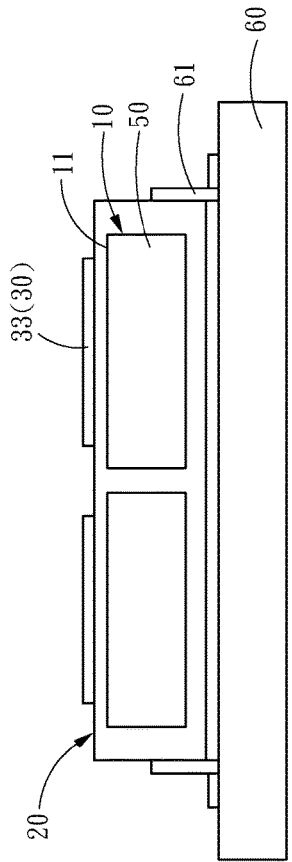
FIG. 3 is a schematic diagram of the use of the present invention.

FIG. 1, FIG. 2 and FIG. 3 show a structural schematic diagram, a partial structural diagram from another perspective and a schematic diagram of the use of the present invention, respectively. Referring to FIG. 1, FIG. 2 and FIG. 3, the present invention is a light emitting diode (LED) structure having two or more light cups and lateral light emission, and is electrically bonded on a circuit board 60 via a bonding pad 61. The package structure includes at least two light cups 10 and a composite material base 20. Each of the at least two light cups 10 comprises a gradually downwardly tapered accommodating space 11.

Figure 4:
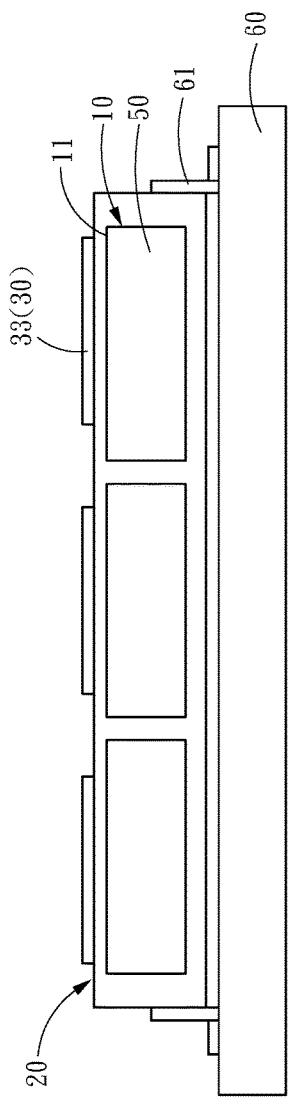
FIG. 4 is a schematic diagram of use according to another embodiment of the present invention.

Referring to FIG. 4, the at least two light cups 10 may be horizontally arranged next to each other, and the light cups 10 may be in a quantity provided according to requirements, preferably two (as shown in FIG. 3) or three (as shown in FIG. 4). It should be noted that the quantity of the light cups 10 is not limited, and may be greater than the above examples in other implementations.

Referring to FIG. 1 and FIG. 2, the composite material base 20 comprises a first surface 21, a second surface 22 adjacent to the first surface 21, a third surface 23 adjacent to the first surface 21, and a fourth surface 24 opposite to the first surface 21. The at least two light cups 10 are provided on the first surface 21. At least two first metal plates 30 and at least two second metal plates 31 having different polarities and corresponding to the quantity of the light cups 10 are provided on the second surface 22. The at least two first metal plates 30 and the at least two second metal plates 31 of the second surface 22 are respectively soldered onto a circuit board 60 (as shown in FIG. 3).

One ends of the at least two first metal plates 30 and the at least two second metal plates 31 pass through the composite material base 20, and extend into the accommodating space 11 of the corresponding light cup 10 to form two electrode contacts 32. The accommodating space 11 is provided with an LED 40 electrically connected to the two electrode contacts 32 and is filled by a package material 50 encapsulating the LED 40. In an actual structure, one electrode of the LED 40 may be directly provided on the electrode contact 32 of the first metal plate 30, and the other electrode is electrically connected to the electrode contact 32 of the second metal plate 31 through a bonding wire (not shown). That is, the electrode contact 32 of the first metal plate 30 and the electrode contact 32 of the second metal plate 31 respectively serve as two electrodes of the LED 40.

Figure 5:
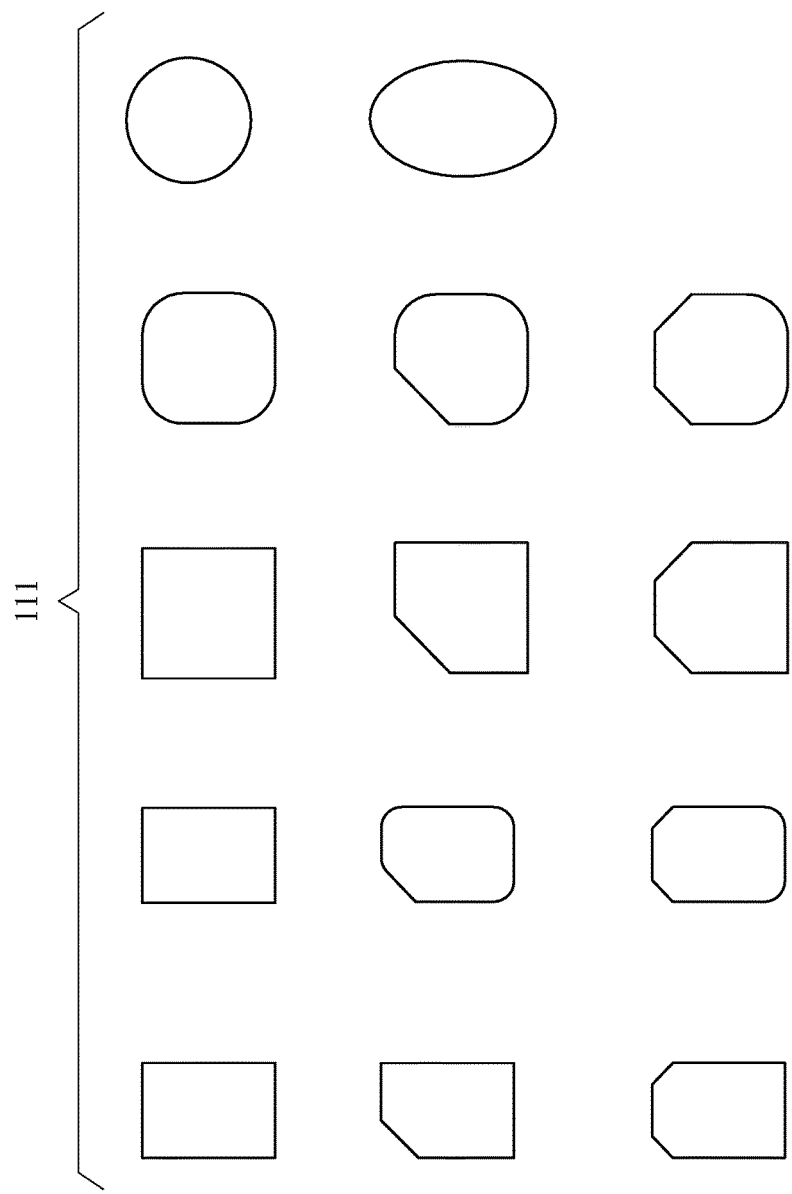
FIG. 5 is a schematic diagram of shapes of openings of different light cups.

Referring to FIG. 5, the accommodating space 11 comprises an opening 111, which is one selected from a group consisting of at least one of a polygon, a circle and an ellipse, provided that an enclosed geometric pattern is used. FIG. 5 depicts several possible shapes. However, the present invention is not limited to the exemplary shapes, and the opening 111 may be designed according to an optical structure in an actual application and structure.

Referring to FIG. 1 and FIG. 2, the other ends of the at least two first metal plates 30 individually extend onto the fourth surface 24 to form an exposed heat dissipation structure 33. It should be noted that, the at least two first metal plates 30 may extend to the third surface 23 to form the exposed heat dissipation structure 33, thus providing the first metal plate 30 with the exposed heat dissipation structure 33 having a greater area, enhancing the heat dissipation efficiency of the LED 40.

The first metal plate 30 of the present invention may be electrically connected to the heat emitting electrode of the LED 40, thus further enhancing the heat dissipation efficiency by the exposed heat dissipation structure 33 of the first metal plate 30.

Figure 6:
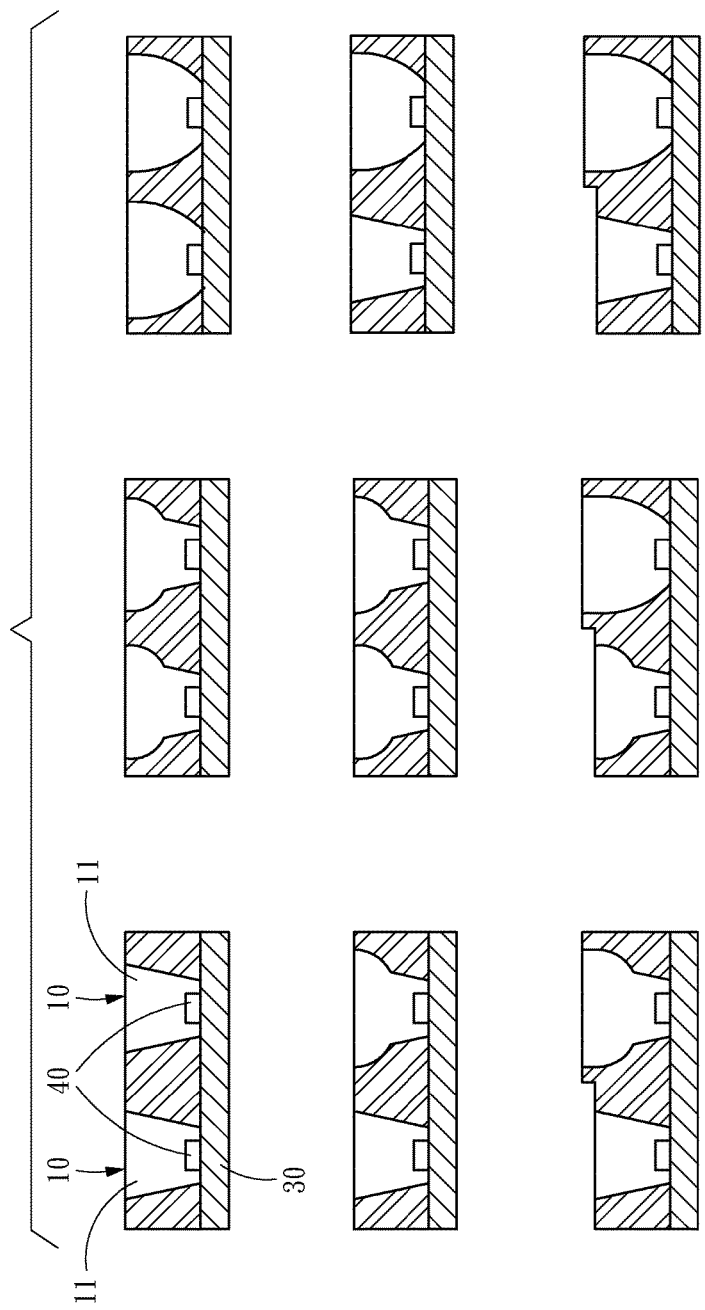
FIG. 6 is a schematic diagram of a combined application of shapes of accommodation spaces of different light cups.

Referring to FIG. 6, the shapes of the accommodating spaces 11 of the at least two light cups 10 of the present invention may be the same or different, and have multiple combinations. For example, the shapes may have a straight line pattern, an arc pattern, or a combination pattern of straight lines and arcs, and may have different heights, widths, slopes (for straight lines) and curvatures (for arcs). Different combination patterns generate different reflection effects, and may be designed according to actual application needs. FIG. 6 depicts possible combinations, and the present invention is not limited to these examples.

In conclusion, the present invention provides following advantages compared to the prior art.

1. The first metal plate may simultaneously serve as an electrode and a heat dissipation structure. Thus, the heat in the LED device can be effectively transmitted to an external side of the LED, further enhancing the heat dissipation effect through heat dissipation by using air convection.

2. The structure of the present invention is simple and uses up minimal space. Thus, the at least two light cups of the present invention can be arranged side by side and provide lateral light emission without causing the issue of overheating, satisfying the requirements for a high light intensity and an output of multiple wavelength light sources.

3. The first metal plate may further extend onto the third surface and form the exposed heat dissipation structure having a greater area to provide more significant heat dissipation effects. When the first metal plate is connected to an electrode having a higher temperature of the LED, heat dissipation can be performed further by air convection through the exposed heat dissipation structure at the external side, thus enhancing heat dissipation efficiency.

What is claimed is:

1. A high heat dissipation light emitting diode (LED) package structure having at least two light cups and lateral light emission, comprising:

at least two light cups, each of the two light cups having an accommodating space gradually downwardly tapered; and a composite material base, having a first surface, a second surface adjacent to the first surface, a third surface adjacent to the first surface and a fourth surface opposite to the first surface;

wherein, the at least two light cups are provided on the first surface, at least two first metal plates and at least two second metal plates having different polarities and corresponding to a quantity of the light cups are provided on the second surface, one ends of the at least two first metal plates and the at least two second metal plates individually pass through the composite material base and extend into the accommodating space to form two electrode contacts, one other ends of the at least two first metal plates individually extend onto the fourth surface to form an exposed heat dissipation structure, and the at least two first metal plates extend onto the third surface to form the exposed heat dissipation structure.

2. The LED package structure having at least two light cups and lateral light emission of claim 1, wherein the accommodating space comprises an opening, and the opening is one selected from a group consisting at least one of a polygon, a circle and an ellipse.

3. The LED package structure having at least two light cups and lateral light emission of claim 1, wherein the at least two light cups are arranged horizontally side by side.

4. The LED package structure having at least two light cups and lateral light emission of claim 1, wherein the accommodating space is provided with an LED connected to the two electrode contacts and a filled by a package material encapsulating the LED.

5. The LED package structure having at least two light cups and lateral light emission of claim 1, wherein the at least two first metal plates and the at least two metal plates of the second surface are soldered onto a circuit board.

6. The LED package structure having at least two light cups and lateral light emission of claim 1, wherein shapes of the accommodating spaces of the at least two light cups are identical.

7. The LED package structure having at least two light cups and lateral light emission of claim 1, wherein shapes of the accommodating spaces of the at least two light cups are different.

* * * * *

UNITED STATES PATENT AND TRADEMARK OFFICE
CERTIFICATE OF CORRECTION

| | | |
|---|---|---|
| PATENT NO. | : 10,361,352 B1 | Page 1 of 1 |
| APPLICATION NO. | : 15/928736 | |
| DATED | : July 23, 2019 | |
| INVENTOR(S) | : Chun-Der Wu et al. | |

It is certified that error appears in the above-identified patent and that said Letters Patent is hereby corrected as shown below:

On the Title Page

(73) Assignee should be changed to --EXCELLENCE OPTO. INC., CHUNAN TOWN, MIAOLI COUNTY (TW)--

Signed and Sealed this
Twenty-eighth Day of April, 2020

Andrei Iancu
*Director of the United States Patent and Trademark Office*